(12) United States Patent
Aromin

(10) Patent No.: US 12,292,475 B1
(45) Date of Patent: May 6, 2025

(54) HIGH FREQUENCY RESISTANT NUISANCE TRIPPING GFCI AND WITH SELF-TEST AND END OF LIFE (STEOL) CIRCUITS

(71) Applicant: Tower Manufacturing Corp., Providence, RI (US)

(72) Inventor: Victor V Aromin, West Warwick, RI (US)

(73) Assignee: Tower Manufacturing Inc., Providence, RI (US)

(*) Notice: Subject to any disclaimer, the term of this patent is extended or adjusted under 35 U.S.C. 154(b) by 0 days.

(21) Appl. No.: 18/760,562

(22) Filed: Jul. 1, 2024

(51) Int. Cl.
*G01R 31/327* (2006.01)

(52) U.S. Cl.
CPC .................. *G01R 31/3278* (2013.01)

(58) Field of Classification Search
CPC .................. G01R 31/3278; G01R 31/00
See application file for complete search history.

(56) References Cited

U.S. PATENT DOCUMENTS

| | | | |
|---|---|---|---|
| 4,918,977 A | 4/1990 | Takahaski et al. | |
| 5,517,165 A | 5/1996 | Cook | |
| 5,943,199 A * | 8/1999 | Aromin | H01H 83/04 361/45 |
| 6,052,266 A * | 4/2000 | Aromin | H01H 47/04 361/49 |
| 6,128,169 A * | 10/2000 | Neiger | H02H 3/334 324/520 |
| 6,144,209 A | 12/2000 | Raymond et al. | |
| 6,218,647 B1 | 4/2001 | Jones | |
| 6,738,241 B1 * | 5/2004 | Aromin | H02H 1/0015 361/45 |
| 7,307,211 B1 | 12/2007 | Caccia | |
| 7,492,558 B2 | 2/2009 | Germain et al. | |
| 8,384,502 B2 | 2/2013 | Gao | |
| 8,587,914 B2 | 11/2013 | Kamor et al. | |
| 8,659,857 B2 | 2/2014 | Gandolfi | |
| 8,760,824 B2 | 6/2014 | Armstrong | |
| 9,312,680 B2 | 4/2016 | Li et al. | |
| 9,450,395 B2 | 9/2016 | Aromin et al. | |
| 9,466,971 B2 * | 10/2016 | Aromin | H01R 13/7135 |
| 9,478,382 B1 | 10/2016 | Aromin | |
| 9,608,433 B2 | 3/2017 | Simonin | |
| 9,966,165 B2 | 5/2018 | Gross et al. | |
| 10,001,526 B2 | 6/2018 | Salas | |
| 10,020,649 B2 | 7/2018 | Du | |
| 10,877,105 B1 * | 12/2020 | Aromin | H01H 83/02 |
| 11,063,419 B2 | 7/2021 | Aromin | |
| 11,329,476 B1 * | 5/2022 | Aromin | H02H 3/16 |
| 2004/0100742 A1 * | 5/2004 | Brown | H02H 3/04 361/42 |

(Continued)

*Primary Examiner* — Eman A Alkafawi
*Assistant Examiner* — Suresh K Rajaputra

(57) ABSTRACT

A High Frequency ground fault circuit interrupter (HF-GFCI) resistant to high frequency nuisance tripping with end-of-life self-testing is provided. The HF GFCI includes a circuit breaker and a relay circuit for controlling the circuit breaker. The HF-GFCI also includes a fault detecting circuit and latch circuit. Also provided is an isolation circuit for isolating the latch circuit and the fault detecting circuit during self-test; and a self-test circuit for testing the latch circuit and the fault detecting circuit. The HF-GFCI provides an end-of-life circuit for disabling the HF-GFCI if self-test fails.

14 Claims, 4 Drawing Sheets

(56) References Cited

U.S. PATENT DOCUMENTS

| | | | |
|---|---|---|---|
| 2005/0083616 A1* | 4/2005 | Reid | H02H 3/167 |
| | | | 361/42 |
| 2005/0243485 A1* | 11/2005 | Gershen | H02H 5/105 |
| | | | 361/42 |
| 2010/0309592 A1* | 12/2010 | Kinsel | H02H 3/331 |
| | | | 361/50 |
| 2011/0209894 A1 | 9/2011 | Williams et al. | |
| 2018/0017611 A1 | 1/2018 | Radun et al. | |
| 2018/0337530 A1 | 11/2018 | Gariboldi et al. | |

* cited by examiner

HIGH FREQUENCY RESISTANT NUISANCE TRIPPING GFCI AND WITH SELF-TEST AND END OF LIFE (STEOL) CIRCUITS

1. FIELD OF USE

The present invention relates generally to electrical safety devices and more particularly to ground fault circuit interrupters (GFCI) with self-test end-of-life circuitry and resistant to high frequency nuisance tripping.

2. DESCRIPTION OF PRIOR ART (BACKGROUND)

Conventional electrical appliances typically receive alternating current (AC) power from a power supply, such as an electrical outlet, through a pair of conducting lines. The pair of conducting lines, often called the line and neutral conductors, enable the electrical appliance, or load, to receive the current necessary to operate.

The connection of an electrical appliance to a power supply by a pair of conducting lines creates several potentially dangerous conditions. There exists the risk of ground fault, grounded neutral, and open neutral conditions in the conducting lines. A ground fault condition occurs when there is an imbalance between the currents flowing in the line and neutral conductors. A grounded neutral condition occurs when the neutral conductor is grounded at the load. An open neutral condition exists when the neutral conductor is open between the load and the source.

Ground fault circuit interrupters are well known in the art and are commonly used to protect against ground fault, grounded neutral, and open neutral conditions. GFCI devices sense ground fault and grounded neutral conditions in the conducting lines and in response thereto, open at least one of the conducting lines between the power supply and the load to eliminate the dangerous condition.

A typical ground fault interrupter includes an operational amplifier which amplifies the sensed ground fault signal and applies the amplified signal to a window comparator which compares it to positive and negative reference signals. If either reference value is exceeded, a trip signal is generated. A common type of ground fault detection circuit is the dormant oscillator detector. This detector includes a first sensor coil through which the line and neutral conductors of the protected circuit pass. The output of the first sensor coil is applied through a coupling capacitor to the above-described operational amplifier followed by a window comparator. A line-to-ground fault causes the amplified signal to exceed the reference value and generates a trip signal.

Ground fault interrupters include ground fault circuit breakers, ground fault receptacles, and even cord mounted ground fault protection devices. Ground fault interrupters may be troubled by false tripping, even though they pass all present industry standards. One cause of false tripping may be disconnection of the power to inductive appliances, particularly by unplugging the appliances.

Examples of these appliances include electric shavers, high intensity lamps, and small cooling fans, such as are used for cooling electronic equipment. Unplugging these appliances may generate an arc between the plug and the receptacle, resulting in the superimposition of several volts of wide band noise onto the power line. Due to the wide band nature of the noise, even a small stray coupling capacitance will couple the noise from the power line conductor into the ground fault circuit, causing a false trip.

It has been found that the wide band noise pulses induced by load related switching phenomena, such as caused by unplugging inductive appliances, can cause false tripping of typical ground fault interrupters. The wide band noise pulses typically contain frequency components ranging from greater than 60 Hz up to 150 KHz.

Another cause of false tripping of typical GFCIs may be due to the typical construction of the appliance, such as a clothes washing machine, refrigerator, or an air conditioner, constructed with variable speed drives, electronic circuits, and/or inverter drives. These devices can, typically, exhibit high frequency, e.g., greater than 60 Hz, leakage current flowing through the grounding conductor of the appliance power supply cord to the building power system.

Another drawback of typical GFCI devices is that the GFCI device generally includes a large solenoid to selectively open and close the switching device. Specifically, the solenoid generally requires a constant supply of line voltage (about 120 volts) to switch and sustain the solenoid in its energized state. So the solenoid acts as a large power drain source.

Further, the standard UL943 requires panel mounted and receptacle based GFCIs to indicate "end of life" if the GFCI device fails to trip when the test button is manually operated. However, even if end-users regularly tested their devices, a GFCI device that did not test properly could still be reset, and continue to provide power, without providing ground-fault protection. Without a built-in power denial feature, a consumer could incorrectly, and tragically, assume that if power is available, so is protection. Many end users were (and continue to remain) unaware of the need for regular testing, despite manufacturers' warnings; and others, who were aware, were not always conscientious in performing the testing.

End-of-life events test the ground fault sensing parts (toroids and integrated circuit) are open or short circuited; the trip solenoid and/or its control circuit is faulty, or the switching semiconductor (SCR) controlling the trip solenoid control circuit is open or short circuited.

Thus, there is a need for a solenoid of enough rating for a line voltage GFCI device but with reduced tendency to fail due to high voltages and currents associated with typical line voltages. There is also a need for a ground fault interrupter which does not generate a false trip in response to wide band noise in the protected circuit. There is also a need for GFCIs with improved tripping resistance to wide band signals and/or frequency components greater than 60 Hz.

There is also a need for a GFCI with manual and automatic testing of the often-failed parts of a GFCI and denial of power or end-of-life switching if automatic testing fails.

SUMMARY OF THE INVENTION

It is an object of the present invention to provide a new and improved ground fault circuit interrupter (GFCI).

It is another object of the present invention to provide a GFCI which senses ground fault and grounded neutral conditions in the conducting lines, and in response thereto, includes a solenoid which opens at least one of the conducting lines between the power supply and the load.

A high frequency (HF) ground fault circuit interrupter (GFCI) with end-of-life self-testing for interrupting the flow of current through a pair of lines is provided. One of the pair of lines extends between a line input and a line output and the other line extends between a neutral input and a neutral output. The HF GFCI includes a first switch having a first input terminal and a first contact terminal and a second switch having a second input terminal and a second contact terminal; and at least one relay circuit for controlling the first and/or second switch. Each switch has a first non-energized position and a second energized position and wherein the first switch is connected between the line input and the line output and the second switch is connected between the neural input and the neutral output. The HF GFCI also includes a fault detection circuit for detecting a ground fault in the line or neutral output. The fault detection circuit includes one sense transformer for sensing the ground fault in the line or neutral output. To eliminate high frequency crosstalk and subsequent high frequency nuisance tripping the fault detection circuit does not comprise a second sense transformer. The fault detection circuit also includes an electronic latch circuit for de-energizing the relay circuit when a fault is detected. The HF GFCI also includes a test module integrated with the HF GFCI. The test module includes a simulated ground fault generator for simulating a ground fault; an auto-monitoring logic module; a relay synchronized switch; and an end-of-life switch for disabling the at least one relay circuit. Also included is a power supply circuit connected to the line input for powering the test module, the first bi-stable electronic latch circuit, the fault detection circuit, and the relay circuit. The HF GFCI also includes a common neutral wire connected to the neutral input and the test module, the first bi-stable electronic latch circuit, the fault detection circuit, the relay circuit, and the power circuit, and wherein an open neutral input condition sets the first and second switches to the first non-energized position Also provided is a GFCI circuit for interrupting the flow of current through a pair of lines, wherein one of the pair of lines extends between a line input and a line output and the other line extends between a neutral input and a neutral output. The GFCI includes at least one relay-controlled switch disposed between the input and out lines. The GFCI circuit includes an auto test module for auto testing and detecting an end-of-life condition. The auto test module includes a simulated ground fault generator for simulating a ground fault; an auto-monitoring logic module; a relay synchronized switch; and an end-of-life switch for disabling the GFCI circuit if the GFCI circuit fails the auto test. The auto test module also includes a common neutral wire connected to the neutral input, and wherein an open neutral input condition de-energizes the relay-controlled switch and interrupts the flow of current between the input and output lines.

The invention is also directed towards GFCI with end-of-life self-testing for interrupting the flow of current through a pair of lines, where one of the pair of lines extends between a line input and a line output and the other line extends between a neutral input and a neutral output The HF GFCI includes a first switch having a first input terminal and a first contact terminal; a second switch having a second input terminal and a second contact terminal; and at least one relay circuit for controlling the first and/or second switch. The GFCI includes a fault detection circuit for detecting a ground fault in the line output or a grounded neutral on a load side of the GFCI. The fault detection circuit includes one sense transformer for sensing the ground fault or grounded neutral on the load side of the GFCI. To eliminate high frequency cross talk and subsequent high frequency nuisance tripping the fault detection circuit does not include a second sense transformer. The GFCI includes an electronic latch circuit for de-energizing the relay circuit when a ground fault is detected. The GFCI also includes a test module for self-testing. The test module includes a simulated ground fault generator for simulating a ground fault; an auto-monitoring logic module; a relay synchronized switch; and an end-of-life switch for de-energizing the relay circuit if self-test fails. The GFCI also includes a power supply circuit connected to the line input for powering the test module, the electronic latch circuit, the fault detection circuit, and the relay circuit. The GFCI also includes a common neutral wire connected to the neutral input and the test module, the electronic latch circuit, the fault detection circuit, the relay circuit, and the power circuit. An open neutral input condition de-energizes the relay and opens the first and second switches.

The invention also includes an auto-monitoring logic module that measures a predetermined number of failures of the GFCI circuit in response to the simulated ground fault signals to test the GFCI circuit. When the predetermined number of failures exceed a predetermined threshold the GFCI circuit is switched off. The tested GFCI circuit includes a sense transformer; a GFCI Integrated Circuit (IC) coupled to the sense transformer; and an electronic latch circuit.

More objects, as well as features and advantages, of the present invention will be in the description which follows, and in part will be obvious from the description or may be learned by practice of the invention. In the description, reference is made to the drawings which form a part thereof and in which is shown by way of illustration specific embodiments for practicing the invention. These embodiments will be described in enough detail to enable those skilled in the art to practice the invention, and it is to be understood that other embodiments may be used and that structural changes may be made without departing from the scope of the invention. The following detailed description is not to be taken in a limiting sense, and the scope of the present invention is best defined by the appended claims.

BRIEF DESCRIPTION OF THE DRAWINGS

The drawings, which are incorporated into and are a part of this specification, illustrate various embodiments of the invention and, together with the description, explain the principles of the invention. In the drawings wherein like reference numerals represent like parts.

DETAILED DESCRIPTION

The following brief definition of terms shall apply throughout the application:

The term "comprising" means including but not limited to, and should be interpreted in the way it is typically used in the patent context;

The phrases "in one embodiment," "according to one embodiment," generally mean that the particular feature, structure, or typical following the phrase may be included in at least one embodiment of the present invention, and may be included in more than one embodiment of the present invention (such phrases do not necessarily refer to the same embodiment);

If the specification describes something as "exemplary" or an "example," it should be understood that refers to a non-exclusive example; and If the specification states a part or feature "may," "can," "could," "should," "preferably," "possibly," "typically," "optionally," "for example," or "might" (or other such language) be included or have a characteristic, that part or feature need not be included or to have the characteristic.

High frequency may be defined as greater than 60 Hz up to 150 KHz.

Ground fault conditions may be defined as ground fault, grounded neutral, and open neutral conditions.

Figure 1:
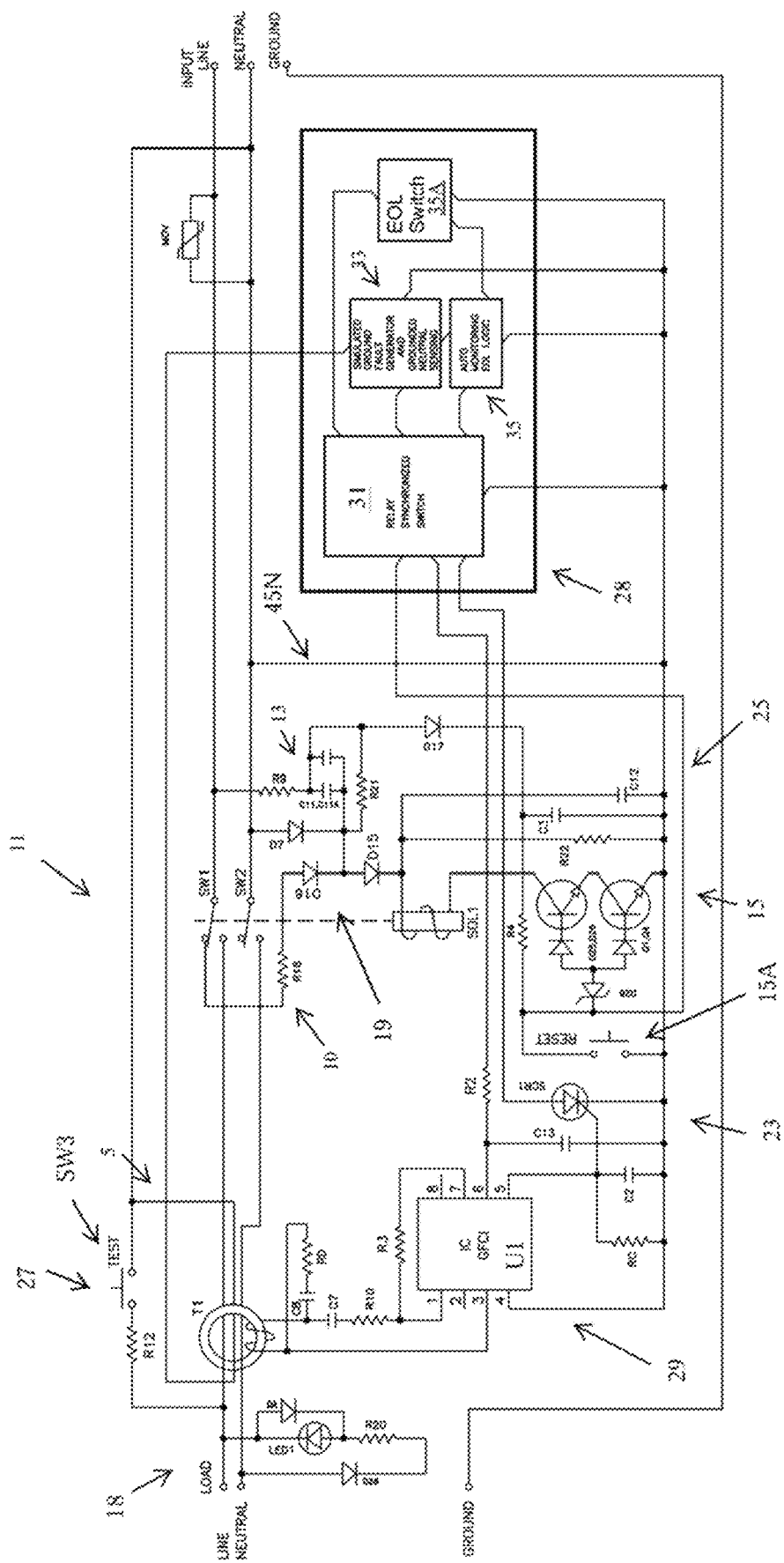
FIG. 1 is a schematic circuit diagram of an auto reset ground fault circuit interrupter (GFCI) with High Frequency (HF) tripping resistance, reduced operational solenoid power, and STEOL of the present invention.

Referring now to the drawings and more particularly to FIG. 1, there is shown a ground fault circuit interrupter (GFCI) circuit constructed according to the teachings of the present invention, the GFCI being represented generally by reference numeral 11.

GFCI 11 automatically protects a load from ground fault conditions upon the initial connection of Input L to Load L and Input N to Load N. Furthermore, once GFCI 11 protects the load from a ground fault condition, GFCI 11 can be reset via a reset switch.

GFCI 11 includes a circuit breaker 10, a relay circuit 15, a power supply circuit 13, a booster circuit 19, a fault detection circuit 29, a bi-stable electronic latch circuit 23, a filter circuit 25, an indicator circuit 18, and a trip indicating circuit wire 5. GFCI 11 also includes a test module 28. The test module 28 includes a relay synchronized switch 31, a self-test circuit 33, and an end of life circuit 35 and an end of life switch 35A. It will be appreciated that the circuits are powered by supply line input L and return line N via line 45N. It will be further appreciated that an open neutral on the input side of the GFCI 11 disables SOL 1 which prevents line voltage being applied to the output load.

Circuit breaker 10 includes a pair of single-pole, double-throw switches SW1 and SW2 in the line and neutral conductive lines, respectively, between a power source and a load. Circuit breaker 10 acts to selectively open and close the pair of conductive lines. Switches SW1 and SW2 can be positioned in either of two connective positions. In the first connective position, which is illustrated in FIG. 1, switches SW1 and SW2 are positioned such that the input power source is not connected to the load but is connected to booster circuit 19. In the second connective position, which is the opposite position illustrated in FIG. 1, switches SW1 and SW2 are positioned such that the input power source is connected to the load but not to booster circuit 19.

It will be appreciated that the circuits are powered by supply line input L and return line N via line 45N. It will be further appreciated that an open neutral on the input side of the GFCI 11 disables SOL 1 which prevents SW1 and SW2 from their second connective state.

Relay circuit 15 selectively positions switches SW1 and SW2 in either its first connective position or its second connective position. Relay circuit 15 comprises a solenoid SOL1, transistors Q1, Q4, Diodes D25, D26; and a biasing circuit comprising resistor R4, Zener D28, and reset switch 15A.

Solenoid SOL1 is ganged to the circuit breaker contacts of switches SW1 and SW2 and is responsible for selectively controlling the connective position of switches SW1 and SW2. Before power is applied to GFCI 11, solenoid SOL1 switches SW1 and SW2 are in the first connective position as shown. When solenoid SOL1 is energized, solenoid SOL1 positions switches SW1 and SW2 to the second connective position.

The particular construction of solenoid SOL1 in the present invention is unique for GFCI devices. SOL1 is significantly small in size and requires less power than most solenoids used in prior art GFCI devices. Specifically, solenoid SOL1 has a coil resistance of about 5,000 ohms. Because of the unique construction of solenoid SOL1, line voltage (about 120 volts RMS) must be directly supplied to solenoid SOL1 via booster circuit 19 to first energize solenoid SOL1.

Booster circuit 19 supplies a temporary voltage sufficient to first energize solenoid SOL1 from its de-energized state. Booster circuit 19 comprises silicon rectifiers D15 and D16 and a surge limit resistor R18. Rectifiers D15 and D16 are preferably IN4007 and convert the AC power in the line of the power source to DC power. When switch SW1 is in its first position and upon the application of power to GFCI 11, rectifiers D15 and D16 provide an instant DC voltage, about 126V DC average, to solenoid SOL1 causing solenoid SOL1 to energize which causes solenoid SOL1 to move switches SW1 and SW2 to their second connective position. When switches SW1 and SW2 are moved to their second connective position, booster circuit 19 diode D16 and resistor R18 are disconnected from the line power source.

Once energized, a minimum constant voltage of about 28 volts DC must be supplied to solenoid SOL1 to keep it in its energized state. Booster circuit 19 provides line voltage to first energize solenoid SOL1 from its de-energized state to its energized state and power supply circuit a minimum constant voltage to maintain solenoid SOL1 in its energized state. Capacitive power supply circuit 13 provides about 37 VDC (mean value) The reduction in the voltage required to maintain solenoid SOL1 in its energized state (about 83 volts) significantly reduces the power drain of SOL1 in circuit 11 and reduces heat build-up which would reduce solenoid SOL1 useful life.

Relay circuit 15 transistors Q1, Q4 are, for example, MMBTA41 high voltage transistors for controlling current flow through energized solenoid SOL1. When transistors Q1, Q4 are "off", current through solenoid SOL1 is disabled and SOL1 is deenergized. When transistors Q1, Q4 are "on", current flows through solenoid SOL1, energizing SOL1.

Power supply circuit 13 provides power for GFCI circuit 11. Power supply circuit 13 includes rectifier diodes D7 and D15, voltage dropping resistors R9 and R21, and capacitors C11 and C11A. It will be appreciated that capacitors C11 and C11A combined reactance limits the current flowing though rectifiers D7 and D15.

Silicon rectifiers D7 and D15 convert the AC current in the line from the power source into a DC current. Voltage dropping resistors R9 and R21 limit the constant input voltage supplied to solenoid SOL1. Capacitors C11 and C11A may be any suitable value and helps limit the current flowing though rectifiers D7 and D15 and the constant voltage supplied to solenoid SOL1. It will be appreciated that a goal of the capacitive supply circuit arrangement reduces heat buildup in a confined space, optimizes relay coil SOL1 energy to substantially increase the relay contact forces, providing for a smaller, more rugged and higher product performance for the GFCI.

Power supply circuit 13 also includes diode D17 for providing power to the rest of the GFCI circuit 11.

Still referring to FIG. 1. Fault detection circuit 29 detects ground fault, grounded neutral, and open neutral conditions in the conductive lines when switches SW1 and SW2 are in their second connective position. Fault detection circuit 29 comprises a sense transformer T1, a coupling capacitor C7, a noise suppression capacitor C8, a feedback resistor R3, resistor RD, and a ground fault interrupter integrated circuit (IC) U1.

Sense transformer T1 senses the current differential between the line and neutral conductive lines and upon a ground fault condition, e.g., grounded neutral and/or leakage current from the line on the load side of GFCI 11, transformer T1 induces an associated output from its secondary windings. It will be appreciated that only one sense transformer is used thus eliminating high frequency, e.g., greater than 60 Hz, nuisance tripping due to high frequency cross talk between two sense transformers used in typical GFCI circuits.

U1 is an FM2145 low power ground fault interrupter circuit. However, it will be appreciated that any suitable IC may be used. IC U1 amplifies a fault signal generated by transformer T1 and generates an output pulse on pin 5 to activate latch circuit 23.

After detection of a ground fault or grounded neutral condition on the load side of GFCI 11, U1 generates an output pulse on pin 5 to activate latch circuit 23. Activated Latch Circuit 23 deactivates or de-energizes solenoid SOL1. Latch circuit 23 comprises a silicon-controlled rectifier SCR1 operable in either a conductive or a non-conductive state, a noise suppression capacitor C2 and a reset switch 15A.

In its conductive state rectifier SCR1 turns off transistors Q1, Q4 in relay circuit 15 via isolation circuit 31, discussed in more detail herein. Noise suppression capacitor C2 prevents rectifier SCR1, when in its nonconductive state, from firing because of electrical noise in circuit 11. Reset switch 15A is a conventional push-in type switch and when depressed, and shorts the holding current from the anode of rectifier SCR1, causing rectifier SCR1 to turn off when it is in its conductive state.

Resistor R2 and capacitor C13 act as a filter circuit to smooth out the varying DC voltage from the power supply via module 28 and provide a filtered DC voltage to the power input of IC U1. C13 also provides temporary IC VCC when the GFCI 11 is in automatic self-test mode.

Test circuit 27 provides a means of testing GFCI circuit 11. Test circuit 27 comprises a current limiting resistor R12 and a test switch SW3 of conventional push-in type design. When SW3 is depressed to energize test circuit 27, resistor R12 provides a simulated fault current through transformer T1 via test wire 5.

With the load plugged into the power source, if there is a loss of power at the power source, solenoid SOL1 will become de-energized, moving switches SW1 and SW2 back to their first connective position. When power is restored, solenoid SOL1 will become re-energized again, which moves switches SW1 and SW2 to their second position. It will be further appreciated that an open neutral on the input side of the GFCI 11 disables SOL 1 which prevents line voltage being applied to the output load.

Indicator circuit 18 provides a means of visual sign that the GFCI is functioning normally and has not tripped in response to a ground fault or grounded neutral condition. Indicator circuit 18 includes diodes DA, D29, a light emitting diode LED and a current limiting resistor R20. Diode D29 half wave rectifies the AC power of the line to pulsating DC power for diode LED. In a non-interrupt state line voltage L is half wave rectified by the rectifying diode and applied to turn on the LED. If the circuit 11 senses a ground fault condition SOL1 is de-energized; thus removing power from the indicator circuit 18.

Still referring to FIG. 1 Relay Synchronized Switch 31 enables a circuit path between power supply 13 for U1 VCC and SCR1 to turn off transistors Q1, Q4 if U1 detects a ground fault as described earlier.

Self-test circuit 33 isolates the ground fault sensing circuitry (e.g., T1, U1, and SCR1) from normal ground fault sensing operations while the sensing circuitry is automatically tested. Self-test circuit 33 generates a short current pulse on Test Wire 5 through T1 which is sensed by U1 as a ground fault. U1 generates a SCR trigger signal to SCR 1 gate. SCR 1 triggers on if a rising charge stored in Auto Monitoring End of Life Logic 35 exceeds SCR forward on voltage. If U1, SCR1, or Sense Coil T1 are defective SCR1 will not turn on and discharge the rising charge stored in Auto Monitoring End of Life Logic 35. The rising charge will build to End of Life Switch 35A on voltage which will turn off SOL 1 and disengaging output power as described above.

Figure 2:
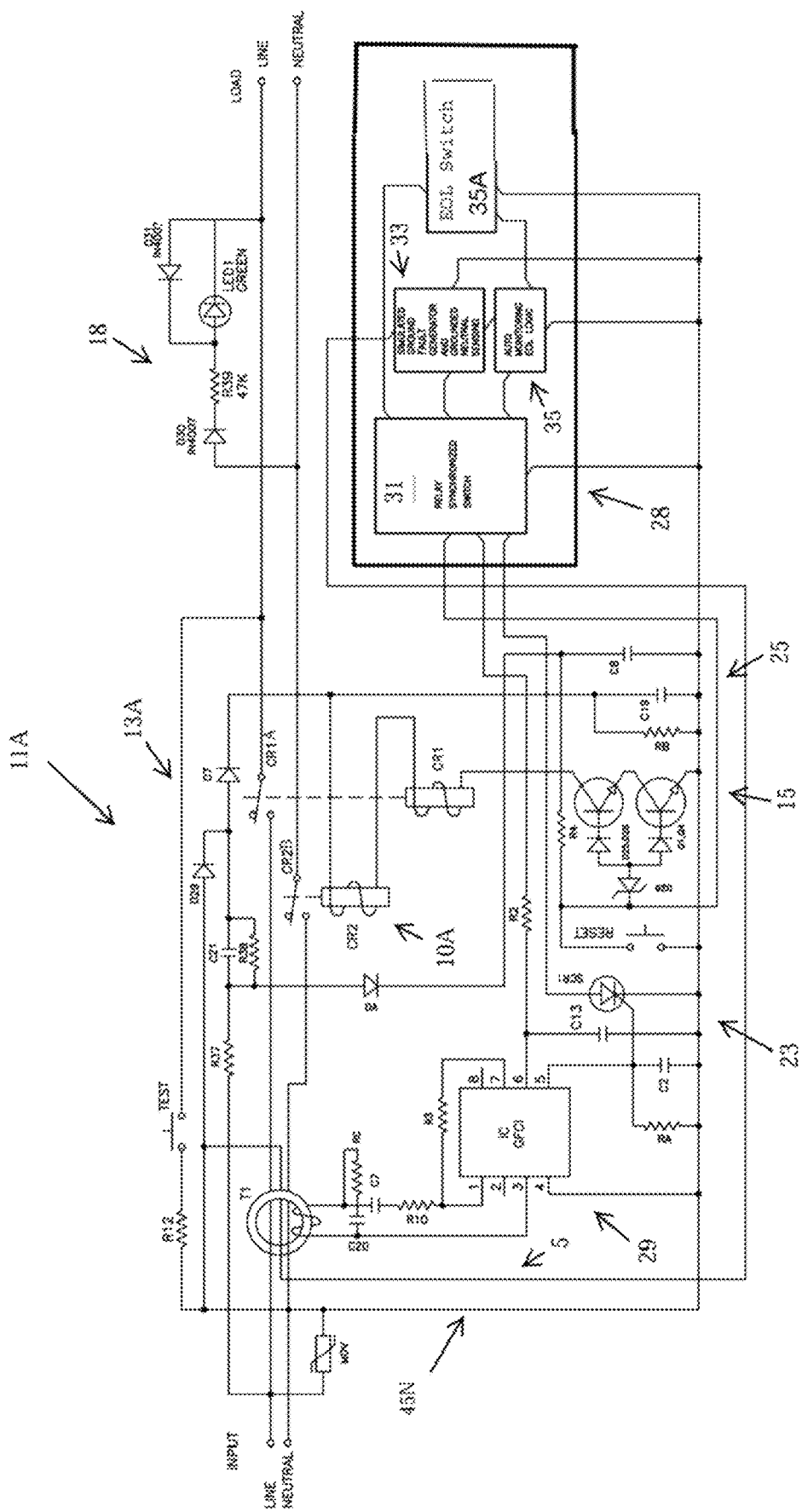
FIG. 2 is a schematic diagram of an alternate embodiment of an auto reset ground fault circuit interrupter (GFCI) with High Frequency (HF) tripping resistance, and STEOL of the present invention.

Referring also to FIG. 2 there is shown a GFCI schematic diagram 11A of an alternate embodiment of a ground fault circuit interrupter (GFCI) with High Frequency (HF) tripping resistance, and STEOL. Circuit 11A has several common circuits shown in FIG. 1 and need not be discussed here. However, it will again be appreciated that only one sense transformer is used thus eliminating high frequency, e.g., greater than 60 Hz, nuisance tripping due to high frequency cross talk between two sense transformers used in typical GFCI circuits.

Still referring to FIG. 2 there is shown dual relay circuit 10A. Circuit 10A includes directional overcurrent relays CR1 and CR2 and associated switches CR1A and CR2A. If the current through CR1 or CR2 exceeds a predetermined value, the relays will open associated switches CR1A and CR2A, thus disconnecting power from the load. It will be further appreciated that an open neutral on the input side of the GFCI 11A disables CR1A and CR2A which prevents line voltage being applied to the output load.

Figure 3:
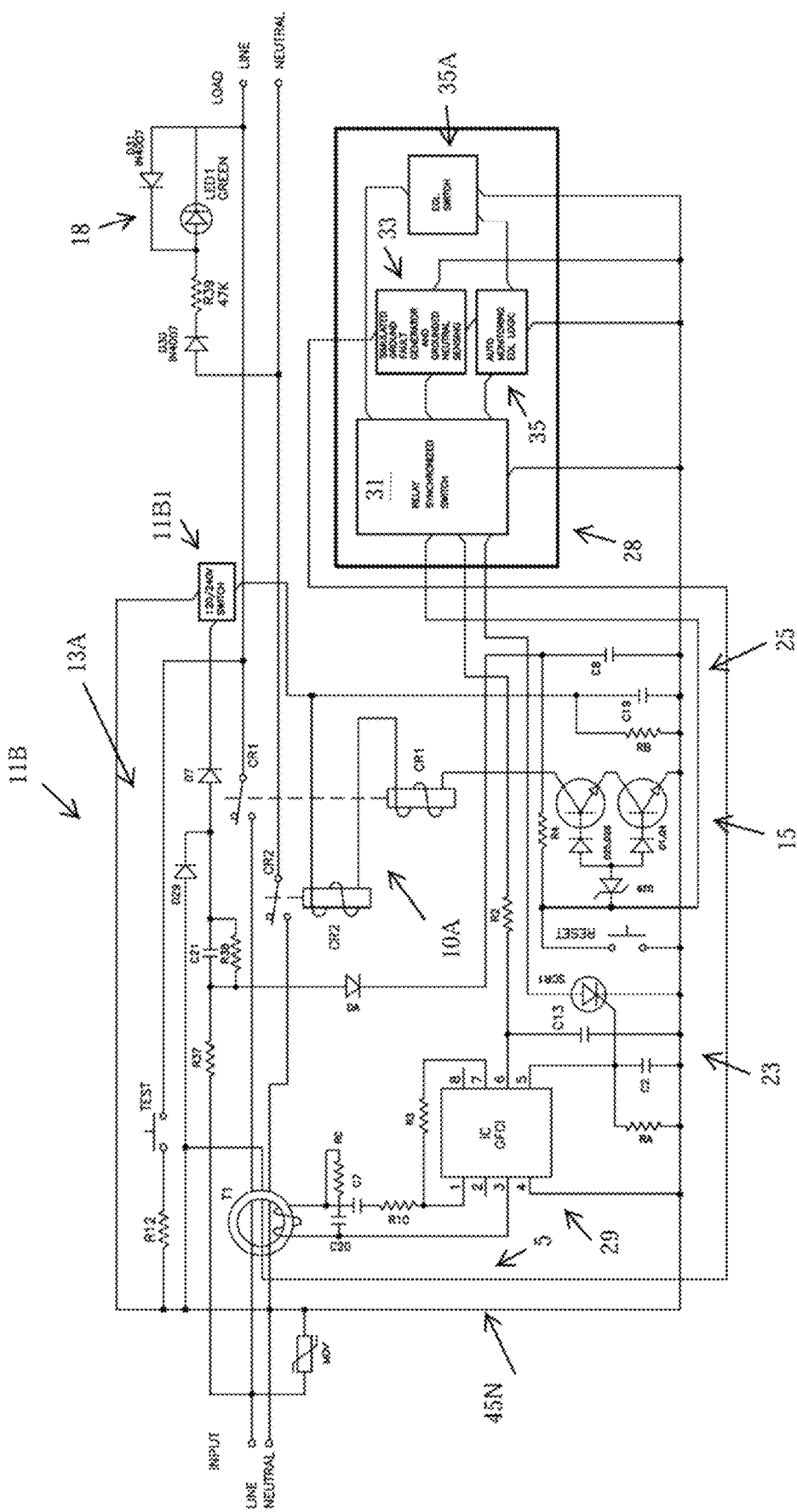
FIG. 3 is a schematic diagram of an alternate embodiment of an auto reset ground fault circuit interrupter (GFCI) with selectable 120/240 volt operation, High Frequency (HF) tripping resistance, and STEOL of the present invention.

Referring also to FIG. 3 there is shown a schematic diagram 11B of an alternate embodiment ground fault circuit interrupter (GFCI) with selectable 120/240 volt operation, High Frequency (HF) tripping resistance, and STEOL of the present invention. Circuit 11B has several of the previously discussed circuits in FIG. 1 and FIG. 2 and need not be discussed here.

Still referring to FIG. 3 there is shown 120/240 volt switch 11B1. Switch 11B1 allows the GFCI circuit 11B to be used in a 120 v or 240 volt line supply circuit. It will be further appreciated that an open neutral on the input side of the GFCI 11B disables CR1A and CR2A which prevents line voltage being applied to the output load.

Figure 4:
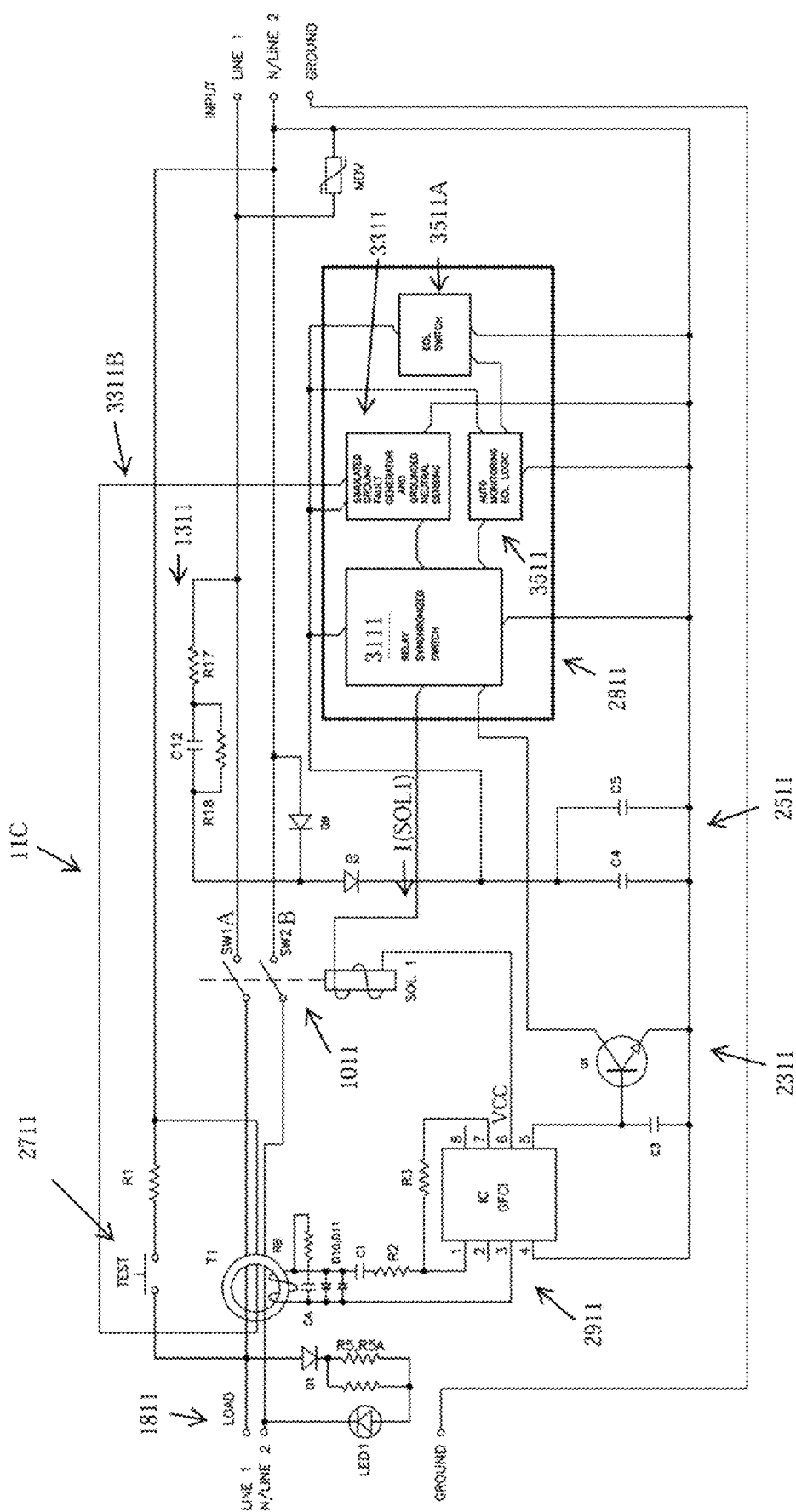
FIG. 4 is a schematic diagram of an alternate embodiment of manual reset ground fault circuit interrupter (GFCI) with High Frequency (HF) tripping resistance and STEOL of the present invention.

Referring also to FIG. 4 there is shown a schematic diagram of an alternate embodiment of manual reset ground fault circuit interrupter (GFCI) 11C with High Frequency (HF) tripping resistance and STEOL of the present invention.

Still referring to FIG. 4, GFCI circuit 11C includes parts arranged as shown and discussed herein. The GFCI circuit includes ganged switches SW1A and SW2B, a relay circuit 1011, a power supply circuit 1311, a fault detection circuit 2911 for detecting an electrical fault, a bi-stable electronic latch circuit 2311, and a test circuit 2711. Also in FIG. 1 is a self-test end-of-life (STEOL) circuit 2811. The STEOL circuit 2811 includes a relay synchronized switch 3111, a simulated ground fault generator and grounded neutral sensing circuit 3311, an end-of-life logic circuit 3511, and End of Life Switch 3511A.

Switches SW1A and SW2B is a ganged manual switch in the line and neutral conductive lines, respectively, between a power source and a load. Switches SW1A and SW2B can be positioned in either of two connective positions. In the first connective position, which is illustrated in FIG. 1, switches SW1A and SW2B are positioned such that the input power source is disconnected from the load. In the second connective position, which is the opposite position illustrated in FIG. 1, switches SW1A and SW2B are positioned such that the input power source is connected to the load.

Relay circuit 1011 acts to selectively position switches SW1 and SW2 in either its first connective position or its second connective position. Relay circuit 1011 comprises a solenoid SOL1. Solenoid SOL1 is ganged to the circuit breaker contacts of switches SW1A and SW2B and is responsible for selectively controlling the connective position of switches SW1A and SW2B. Before power is applied to GFCI 11C, solenoid RL1A position switches SW1 and SW2 are in the connective position as shown in FIG. 4. When current I (SOL1) is supplied to solenoid SOL1 via power supply circuit 1311 via Relay Synchronized Switch 3111 there is not enough current to latch switches SW1A and SW2B, thus requiring manual latching. Once manually latched there is enough current I (SOL1) through solenoid SOL1 to maintain switches SW1A and SW2B in a latched connective position. It will be further appreciated that an open neutral on the input side of the GFCI 11B disables SOL1 which prevents line voltage being applied to the output load.

Power supply circuit 1311 provides power for the GFCI circuit 11c. Power supply circuit 1311 comprises rectifier diodes D9, D2, voltage dropping resistors R18, R17, and capacitors C4, C5 and C12.

Fault detection circuit 2911 detects both ground fault and grounded neutral conditions in the conductive lines when switches SW1 and SW2 are in their second connective position. Fault detection circuit 2111 comprises a sense transformer T1, a coupling capacitor CA, a noise suppression capacitor C1, a feedback resistor R3, Diodes D10, D11, and a ground fault interrupter integrated circuit GFCI IC.

After a ground fault or grounded neutral condition on the load side of GFCI circuit 11C sense transformer T1 senses the current differential between the line and neutral conductive lines and induces an associated output from its secondary winding. Coupling capacitor CA couples the AC signal from the secondary winding of transformer T1 to GFCI IC. Capacitor C1 prevents fault detection circuit 21 from operating in response to line disturbances such as electrical noise and lower level faults. Together capacitor CA and resistor R3 set the minimum fault current at which fault detection circuit 2911 provides an output signal to latch circuit 2311. It will be appreciated that only one sense transformer is used thus eliminating high frequency, e.g., greater than 60 Hz, nuisance tripping due to high frequency cross talk between two sense transformers used in typical GFCI circuits.

After detection of a ground fault or grounded neutral condition GFCI IC generates an output pulse on pin 5 to activate latch circuit 2311. Activated Latch Circuit 2311 deactivates or de-energizes solenoid SOL 1 via Relay Synchronized Switch 3111 by removing energizing current I (SOL1). Latch circuit 2311 comprises NPN transistor Q1, and a noise suppression capacitor C3. Noise suppression capacitor C3 prevents transistor Q1, when in its nonconductive state, from turning on because of electrical noise.

Test circuit 2711 provides a means of testing whether the GFCI circuit is functioning properly. Test circuit 2711 comprises a test switch of conventional push-in type design. When the test switch is depressed to energize test circuit 2711, resistor R1 provides a simulated fault current to transformer T1 similar to a ground fault condition.

The STEOL circuit 2811 includes a relay synchronized switch 3111, a simulated ground fault generator and grounded neutral sensing 3311, an auto monitoring and end of life circuit 3511, and End of Life Switch 3511A.

Simulated ground fault generator (SGFG) 3311 includes the logic and means necessary to simulate a periodic ground fault. SGFG generates a short on pulse on test wire 3311B. The SGFG pulse is sensed by GFCI circuit 2911 as a ground fault. After detection of the simulated ground fault GFCI IC generates an output pulse on pin 5 to activate latch circuit 2311 (Q1)

The SGFG pulse is also sensed by GFCI Relay Synchronized Switch 3111 which includes the logic and means to temporarily turn off the normal GFCI fault detection described above when the SGFGC 3311 generates the short on pulse for auto monitoring the ground fault detection circuit. The tested GFCI parts include the sense transformer T1, the GFCI IC and the bi-stable electronic latch circuit 2311.

It will be appreciated that current I (SOL1) through solenoid SOL1 is the VCC power source for the GFCI IC. It will be further appreciated that the timing window, or pulse period, set by SGFGC is of short enough duration so when SOL1 is temporarily turned off during the auto monitoring EOL window, the collapsing SOL1 magnetic field maintains enough current flow through SOL1 to maintain switches SW1 and SW2 in their connective positions. It will be further appreciated that the collapsing SOL1 magnetic field maintains enough power to the GFCI IC during the auto monitoring EOL window.

The auto-monitoring and EOL logic (monitoring) circuit 3511 determines the number of times Q1 does not turn on during successive auto monitoring EOL windows. If Q2 fails to turn on for a predetermined number of times the GFCI fault detection circuitry is defective and the EOL switch 3511A is activated de-energizing SOL1.

The versions of the present invention described above are intended to be merely exemplary and those skilled in the art shall be able to make many variations and changes to it without departing from the spirit of the present invention. All such variations and changes are intended to be within the scope of the present invention as defined in the added claims. For example, the particular parts which make up the embodiments may be interchanged or combined to form more embodiments.

What is claimed is:

1. A high frequency (HF) ground fault circuit interrupter (GFCI) with end-of-life self-testing for interrupting the flow of current through a pair of lines, wherein one of the pair of lines extends between a line input and a line output and the other line extends between a neutral input and a neutral output, the HF GFCI comprising:

a first switch having a first input terminal and a first contact terminal; a second switch having a second input terminal and a second contact terminal; at least one relay circuit for controlling the first and/or second switch, wherein each switch comprises a first non-energized position and a second energized position and wherein the first switch is connected between the line input and the line output and the second switch is connected between the neural input and the neutral output;

a fault detection circuit for detecting a ground fault in the line output, wherein the fault detection circuit comprises:

a single sense transformer for sensing the ground fault in the line output and wherein the fault detection circuit does not comprise a second sense transformer, and wherein the single transformer is configured to detect both load-side and neutral-to-ground faults, a first bi-stable electronic latch circuit for deenergizing the relay circuit when a fault is detected;

a test module integrated with the HF GFCI, the test module comprising:

a simulated ground fault generator for simulating a ground fault;

an auto-monitoring logic module; a relay synchronized switch;

an end-of-life switch for disabling the at least one relay circuit; and a power supply circuit for powering the test module, the first bi-stable electronic latch circuit, the fault detection circuit, and the relay circuit, wherein the power supply circuit is connected to the line input.

2. The HF GFCI as in claim 1 further comprising a booster circuit for initializing the at least one relay circuit, wherein the booster circuit comprises a diode connected to the first switch deenergized position.

3. The HF GFCI as in claim 1 wherein the power supply circuit comprises:

a capacitive supply circuit connected to the relay circuit, wherein the capacitive supply circuits reduces heat buildup and increases switch contact forces between the first input terminal and the first contact terminal and the second input terminal and the second contact terminal.

4. The HF GFCI as in claim 1 wherein the bi-stable electronic latch circuit comprises a first silicon-controlled rectifier operable in either a conductive or a non-conductive state.

5. The HF GFCI as in claim 4 wherein the fault detection circuit further comprises a GFCI Integrated Circuit (IC) coupled to the sense transformer.

6. The HF GFCI as in claim 5 wherein the auto-monitoring logic module measures a predetermined number of failures of the GFCI circuit in response to the simulated ground fault signals to test the GFCI circuit, wherein the tested GFCI circuit comprises:

the sense transformer;

the GFCI Integrated Circuit (IC) coupled to the sense transformer; and the first bi-stable electronic latch circuit connected to the GFCI IC and wherein the relay synchronized switch is connected to the GFCI IC.

7. The HF GFCI as in claim 6 wherein the relay synchronized switch temporarily turns off normal GFCI fault detection by synchronizing the relay circuit with the generated ground fault signals to maintain the first and second switch in the second energized position.

8. The HF GFCI as in claim 1 wherein the end-of-life (EOL) switch for disabling the relay circuit is operable in response to a signal from the auto-monitoring logic module for setting the first and second switches to the first non-energized position.

9. The HF GFCI as in claim 1 further comprises a common neutral wire connected to the neutral input and the test module, the first bi-stable electronic latch circuit, the fault detection circuit, the relay circuit, and the power circuit, and wherein an open neutral input condition sets the first and second switches to the first non-energized position.

10. A GFCI circuit for interrupting the flow of current through a pair of lines, wherein one of the pair of lines extends between a line input and a line output and the other line extends between a neutral input and a neutral output, the GFCI circuit comprising:

a test module for detecting an end-of-life condition, the test module comprising:

a simulated ground fault generator for simulating a ground fault signal; an auto-monitoring logic module; a relay synchronized switch;

an end-of-life switch for disabling the GFCI circuit;

a common neutral wire connected to the neutral input, and wherein an open neutral input condition sets a first switch and a second switch to a nonenergized position; and one sense transformer, wherein the GFCI circuit does not comprise a second sense transformer and wherein the one sense transformer is configured to detect both load-side and neutral-to-ground faults; and a GFCI Integrated Circuit (IC) coupled to the one sense transformer.

11. The GFCI circuit as in claim 10 wherein the relay synchronized switch synchronizes a GFCI relay circuit with the generated ground fault signal to maintain the GFCI relay circuit in an energized position during the generated ground fault signal.

12. The GFCI circuit as in claim 10 wherein the end-of-life (EOL) switch for disabling the GFCI relay circuit is operable in response to a signal from the auto-monitoring logic module for returning the GFCI relay to a de-energized position.

13. A GFCI with end-of-life self-testing for interrupting the flow of current through a pair of lines, wherein one of the pair of lines extends between a line input and a line output and the other line extends between a neutral input and a neutral output, the HF GFCI comprising:

a first switch having a first input terminal and a first contact terminal; a second switch having a second input terminal and a second contact terminal; at least one relay circuit for controlling the first and/or second switch, wherein each switch comprises a first non-energized position and a second energized position and wherein the first switch is connected between the line input and the line output and the second switch is connected between the neural input and the neutral output and wherein the relay circuit comprises at least one directional overcurrent relay;

a fault detection circuit for detecting a ground fault in the line output, wherein the fault detection circuit comprises:

a sense transformer for sensing the ground fault in the line output and wherein the fault detection circuit does not comprise a second sense transformer and wherein the sense transformer is configured to detect both load-side and neutral-to-ground faults;

a first bi-stable electronic latch circuit for de-energizing the relay circuit when a ground fault is detected;

a test module integrated with the HF GFCI, the test module comprising:

a simulated ground fault generator for simulating a ground fault;

an auto-monitoring logic module; a relay synchronized switch;

an end-of-life switch for disabling the at least one relay circuit; and
a power supply circuit for powering the test module, the first bi-stable electronic latch circuit, the fault detection circuit, and the relay circuit, wherein the power supply circuit is connected to the line input.

14. The GFCI as in claim 13 further comprises a common neutral wire connected to the neutral input and the test module, the first bi-stable electronic latch circuit, the fault detection circuit, the relay circuit, and the power circuit, and wherein an open neutral input condition sets the first and second switches to the first non-energized position.

* * * * *